United States Patent
Ma et al.

(10) Patent No.: US 10,788,164 B1
(45) Date of Patent: *Sep. 29, 2020

(54) LED EMITTER AND LED LAMP HAVING THE SAME

(71) Applicants: Wenbo Ma, Shenzhen (CN); Qiurong Liao, Shenzhen (CN); Yu Li, Shenzhen (CN); Kuo-Hsin Chang, Chiayi (TW); Chung-Ping Lai, Hsinchu County (TW)

(72) Inventors: Wenbo Ma, Shenzhen (CN); Qiurong Liao, Shenzhen (CN); Yu Li, Shenzhen (CN); Kuo-Hsin Chang, Chiayi (TW); Chung-Ping Lai, Hsinchu County (TW)

(73) Assignee: Graphene Lighting China Limited, Nanjing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/424,475

(22) Filed: May 28, 2019

(51) Int. Cl.
*F21K 9/232* (2016.01)
*F21K 9/235* (2016.01)
*H01L 33/50* (2010.01)
*H01L 25/075* (2006.01)
*F21K 9/64* (2016.01)

(52) U.S. Cl.
CPC .............. *F21K 9/232* (2016.08); *F21K 9/235* (2016.08); *F21K 9/64* (2016.08); *H01L 25/0753* (2013.01); *H01L 33/507* (2013.01)

(58) Field of Classification Search
CPC . F21K 9/232; F21K 9/235; F21K 9/64; H01L 25/0753; H01L 33/507
See application file for complete search history.

(56) References Cited

U.S. PATENT DOCUMENTS

| 10,568,177 | B2* | 2/2020 | Chen | H05B 47/16 |
|---|---|---|---|---|
| 2013/0215625 | A1* | 8/2013 | Takeuchi | F21V 23/001 362/363 |
| 2014/0159612 | A1* | 6/2014 | Tong | H05B 45/10 315/297 |
| 2017/0048941 | A1* | 2/2017 | Kondo | F21K 9/238 |
| 2019/0128512 | A1* | 5/2019 | Bai | F21V 23/004 |
| 2019/0371768 | A1* | 12/2019 | You | F21V 23/003 |

FOREIGN PATENT DOCUMENTS

| CN | 204372764 | 6/2015 |
|---|---|---|
| TW | M487587 | 10/2014 |

* cited by examiner

*Primary Examiner* — Alan B Cariaso

(74) *Attorney, Agent, or Firm* — Chun-Ming Shih; LanWay IPR Services

(57) ABSTRACT

A light-emitting diode (LED) emitter and a LED lamp having the same are revealed. The LED emitter includes a first LED chip string, a second LED chip string, a substrate, two electrodes, a high-color-temperature phosphor layer and a low-color-temperature phosphor layer. The substrate where the first LED chip string and the second LED chip string are arranged is electrically connected to the two electrodes. The high-color-temperature phosphor layer and low-color-temperature phosphor layer cover the first LED chip string and the second LED chip string respectively. The total resistance value of the first LED chip string is different from the total resistance value of the second LED chip string.

16 Claims, 3 Drawing Sheets

LED EMITTER AND LED LAMP HAVING THE SAME

BACKGROUND OF THE INVENTION

Technical Field

The present invention relates to a lighting device, especially to a LED lamp having a LED emitter.

Description of Related Art

Owing to rising demand for energy conservation and carbon reduction and increasing environmental awareness, conventional incandescent lights or mercury lamps are gradually replaced by LED lamps in various countries worldwide.

Among various applications of the LED lamps, LED luminaires with different color temperatures are used in different workplaces. For example, warm color with the color temperature below about 3300K makes people feel warm and comfortable and hence suitable for home, residence, dormitory and other places where the temperature is relatively low. As to white light with the color temperature ranging from 3300K to 5300K, it gives people a pleasant, comfortable and peaceful feeling and suitable for stores, hospitals, offices, restaurants, waiting rooms and other places. The cold light whose color temperature is over 5300K is close to natural light. It has a bright feeling and makes people concentrate. Thus it is suitable for offices, conference rooms, classrooms, library reading rooms exhibition windows and other places.

However, most of light emitted from LED filament lamps available now has a single color temperature. Although the brightness of the lamp can be adjusted, the lamp has limited applications, unable to meet requirements for different sites and consumer's needs owing to the non-adjustable color temperature.

There are some lighting devices having LED filament with two different color temperatures available on the market now. Refer to Chinese Pat. Pub. No. CN204372764U published on Jun. 3, 2015 and Taiwanese Pat. Pub. No. M487587 published on Oct. 1, 2014, the color temperature is adjusted through control of the current of two sets of filaments with different color temperatures. Yet the lighting devices have poor color mixing performance owing to differences in the position of the LED filaments and the direction of light projection. Moreover, the circuit board is provided with a plurality of drive elements with larger volume for control of the current of the two sets of LED filaments. Thereby not only the cost is increased, the appearance of the LED lamp and internal wiring layout of the circuit board are also affected. These lead to lower market acceptance.

Thus there is a room for improvement and there is a need to provide a novel LED lamp with features of compact drive units, low cost, easy operation and regulation, color temperature adjustment and better color mixing.

SUMMARY OF THE INVENTION

Therefore it is a primary object of the present invention to provide a LED emitter and a LED lamp having the same that feature on compact driving units, low cost, easy operation and regulation, color temperature adjustment and better color mixing.

In order to achieve the above object, a LED emitter according to the present invention includes a first LED chip string, a second LED chip string, a substrate where the first LED chip string and the second LED chip string are disposed, two electrodes electrically connected to the substrate, a high-color-temperature phosphor layer that covers the first LED chip string and a low-color-temperature phosphor layer that covers the second LED chip string. The first LED chip string includes a plurality of first LED chips connected in series while the second LED chip string is connected to the first LED chip string in parallel and composed of a plurality of second LED chips connected in series. The total resistance value of the first LED chip string is different from that of the second LED chip string.

Preferably, the respective first LED chips and the respective second LED chips have the same resistance value while the number of the first LED chips is different from the number of the second LED chips.

Preferably, the respective first LED chips and the respective second LED chips have different resistance values and the number of the first LED chips is different from the number of the second LED chips.

Preferably, the respective first LED chips and the respective second LED chips have different resistance values while the number of the first LED chips is the same as the number of the second LED chips.

Preferably, materials for the substrate include ceramic, sapphire and metals.

A LED lamp according to the present invention includes: a casing, a base, a support, and at least one LED emitter. The casing consists of a mounting space and an opening communicating with the mounting space. The base is mounted in the mounting space and composed of one end thereof connected to the opening for closing the mounting space and the other end thereof provided with at least one first conductive member. The support is arranged at the base, located at the same side of the base provided with the first conductive member, and having at least one second conductive member.

The LED emitter which is electrically connected to both the first conductive member and the second conductive member includes a first LED chip string, a second LED chip string, a substrate, a high-color-temperature phosphor layer, and a low-color-temperature phosphor layer. The first LED chip string consists of a plurality of first LED chips connected in series. The second LED chip string is connected to the first LED chip string in parallel and composed of a plurality of second LED chips connected in series. The first LED chip string and the second LED chip string are mounted on the substrate. The high-color-temperature phosphor layer covers the first LED chip string while the low-color-temperature phosphor layer covers the second LED chip string. The total resistance value of the first LED chip string is different from that of the second LED chip string.

Preferably, the first LED chip and the second LED chip have the same resistance value while the number of the first LED chips is different from the number of the second LED chips.

Preferably, the resistance value of the first LED chip is different from that of the second LED chip and the number of the first LED chips is different from the number of the second LED chips.

Preferably, the resistance value of the first LED chip is different from that of the second LED chip while the number of the first LED chips the same as the number of the second LED chips.

Preferably, the substrate is made from ceramic, sapphire, or metals.

Preferably, the base includes a core rod, a circuit board and a mounting seat. The circuit board is disposed on one end of the core rod and closing the opening while the mounting seat is fixed on the other end of the core rod, opposite to the end with the circuit board.

Preferably, the first conductive member and the support are arranged at the mounting seat.

Preferably, the base includes a vent pipe that is mounted in the core rod and a part of the vent pipe is inserted through the circuit board.

Preferably, the LED lamp further includes a cap which is connected to the casing and covering the opening.

Preferably, the cap includes a metal threaded housing and an electrical point connected to the metal threaded housing.

Preferably, the base includes two conductive wires. One ends of the two conductive wires are electrically connected to the circuit board while the other ends thereof are connected to the metal threaded housing and the electrical point respectively.

Preferably, the support includes an axial rod connected to the base and a support member disposed on the other end of the axial rod, away from the end connected to the base.

Preferably, the second conductive member is arranged at the support member.

The LED lamp has the advantage of adjustable color temperature gradually changed through the LED emitter with high and low color temperatures during power regulation process. Thus the LED lamp provides better color mixing. Moreover, only drive units used for control of power are disposed on the circuit board so that the volume of the drive units is significantly reduced. Thus not only the cost is down, the operation and the regulation of the LED lamp are also easier. Therefore users' needs are met.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
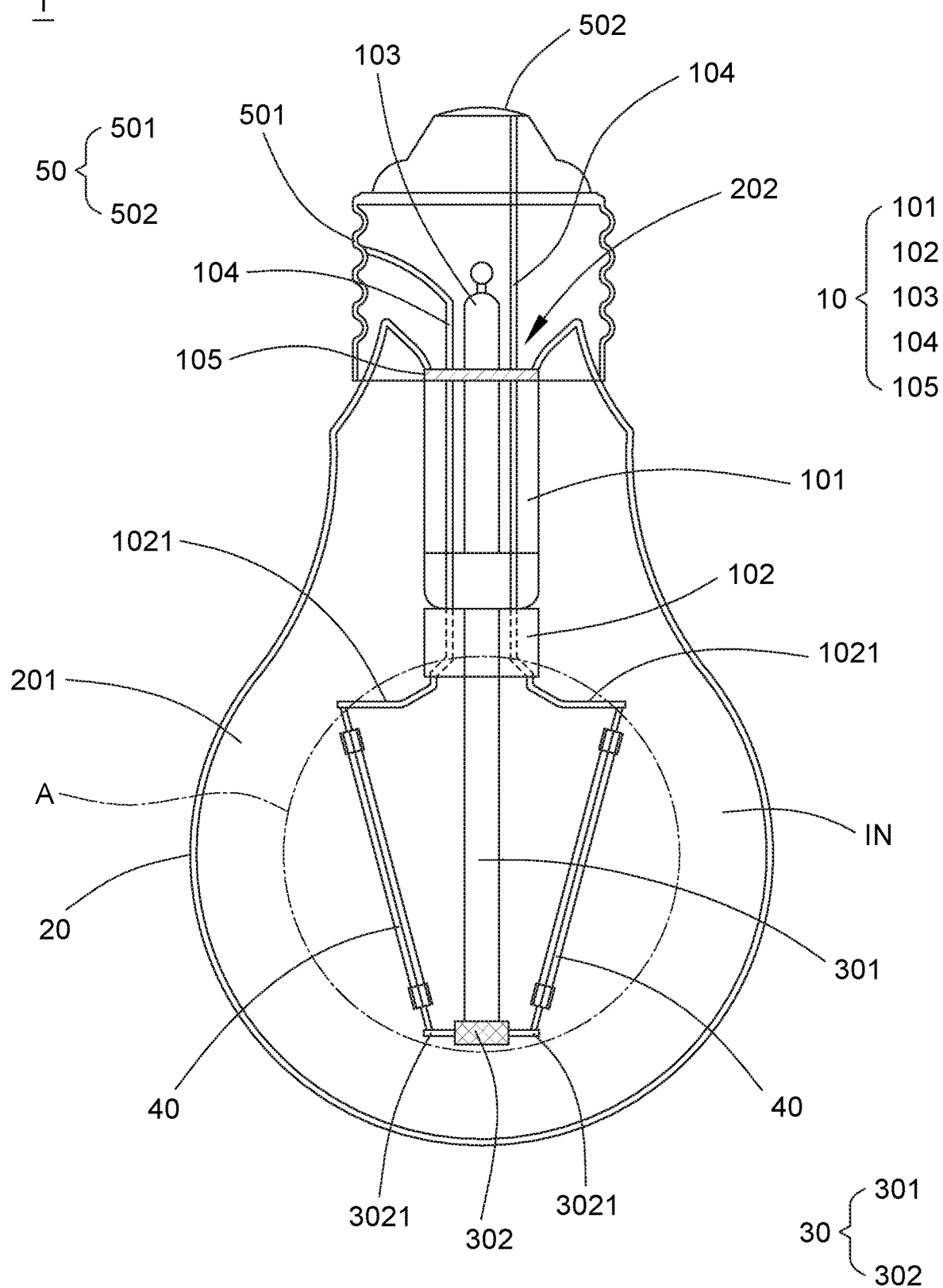
FIG. 1 is a sectional view of an embodiment of a light emitting diode (LED) lamp according to the present invention.

Refer to FIG. 1, a LED lamp 1 according to the present invention is a light bulb composed of a base 10, a casing 20, a support 30, two LED emitters 40 and a cap 50. The casing 20 consists of a mounting space 201 and an opening 202 communicating with the mounting space 201. The base 10 is mounted in the mounting space 201 and one end of the base 10 is connected to the opening 202 for closing the mounting space 201. The cap 50 is connected to an outer surface of the casing 20 and covering the opening 202.

The base 10 is composed of a core rod 101, a mounting seat 102, a vent pipe 103, two conductive wires 104 and a circuit board 105. At least one drive unit (not shown in figure) for control of lamp/luminaire power is arranged at the circuit board 105. The circuit board 105 is disposed on one end of the core rod 101 and closing the opening 202 while the mounting seat 102 is fixed on the other end of the core rod 101, opposite to the end with the circuit board 105. Two first conductive members 1021 are disposed on the surface of the mounting seat 102 and arranged correspondingly to each other. The vent pipe 103 is mounted in the core rod 101 and a part thereof is inserted through the circuit board 105. During assembly of the LED lamp, air in the mounting space 201 is withdrawn through the vent pipe 103. Inert gas or gas with low viscosity and high thermal conductivity can be filled into the mounting space 201 also through the vent pipe 103 for improving heat dissipation of the LED emitters 40. As to the two conductive wires 104 of the base 10, one ends thereof are electrically connected to the circuit board 105 while the other ends thereof are connected to a metal threaded housing 501 and an electrical point 502 of the cap 50 respectively. The electrical point 502 is connected to the metal threaded housing 501. In this embodiment, the core rod 101 of the base 10 is made from glass and the first conductive member 1021 is a metal spring with electrically conductivity and supporting function. In this embodiment, the two conductive wires 104 are electrically connected to the cap 50 in the LED lamp 1. In other embodiment, the cap 50 is not included in the LED lamp 1 and the two conductive wires 104 are directly connected to an external power source.

Still refer to FIG. 1, the support 30 is arranged at the base 10 and located at the same side thereof with the first conductive members 1021. The support 30 consists of an axial rod 301 and a support member 302. One end of the axial rod 301 is connected to the mounting seat 102 of the base 10 while the support member 302 is disposed on the other end of the axial rod 301, away from the end connected to the base 10, and is provided with two second conductive members 3021 arranged correspondingly to each other. In this embodiment, the two second conductive members 3021 are arranged at and fixed on two opposite sides/surfaces of the support member 302, respectively. The second conductive member 3021 is also a metal spring with electrically conductivity and supporting function. Two ends of the respective LED emitter 40 are fixed on and electrically connected to the first conductive member 1021 and the second conductive member 3021, respectively. Moreover, the circuit board 105 is electrically connected to both the first conductive member 1021 and the second conductive member 3021 (not shown in the figure) and used for providing power to the LED emitter 40.

Figure 2:
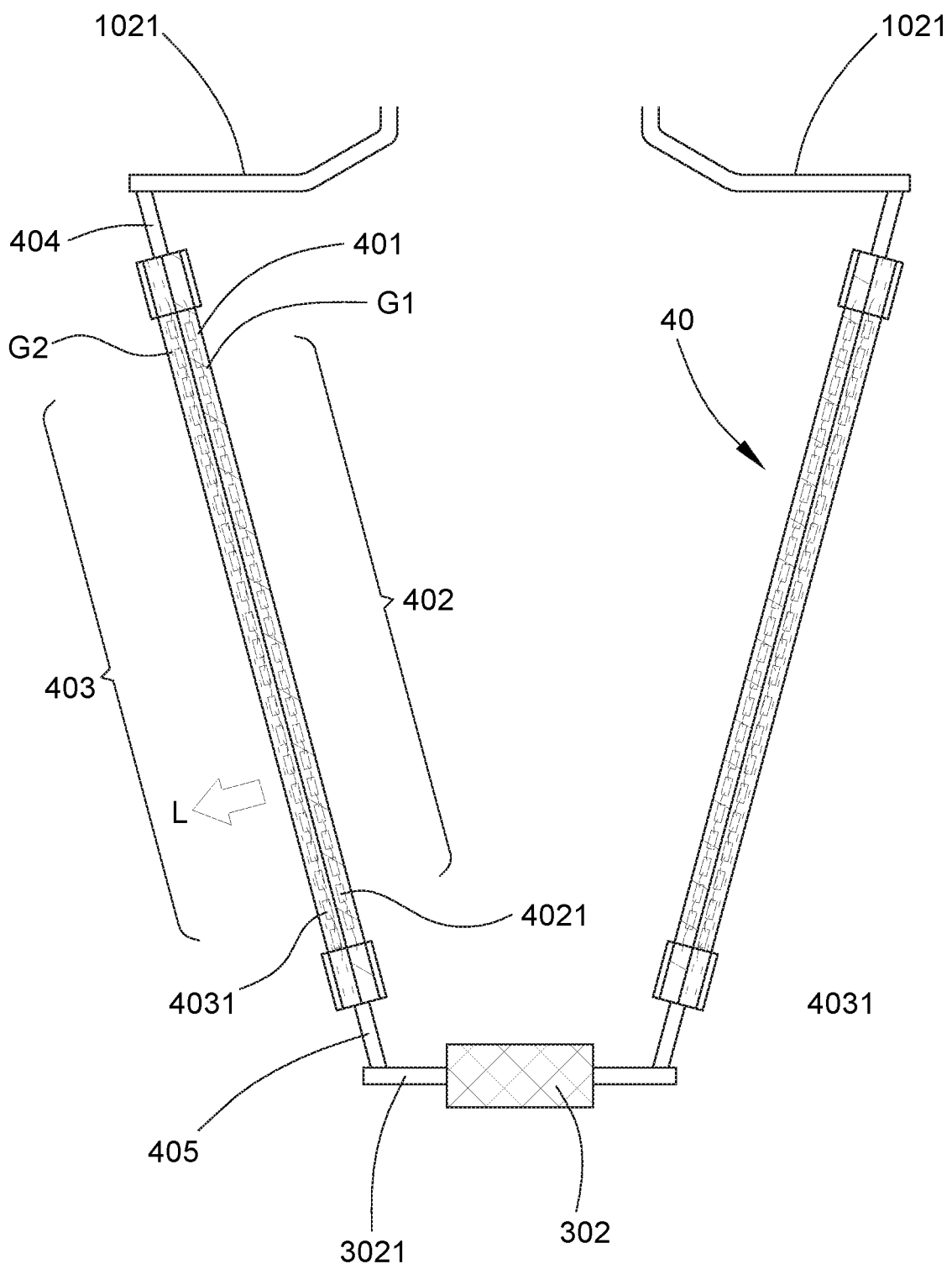
FIG. 2 is an enlarged view of area A of the embodiment in FIG. 1 according to the present invention.

Refer to FIG. 2, an enlarged view of area A in FIG. 1 is revealed. Each LED emitter 40 is composed of a substrate 401, a first LED chip string 402, a second LED chip string 403, a first electrode 404, a second electrode 405, a high-color-temperature phosphor layer G1 and a low-color-temperature phosphor layer G2. The first LED chip string 402 and the second LED chip string 403 are mounted on the substrate 401 that is made from ceramic, sapphire or metals. The first LED chip string 402 includes a plurality of first LED chips 4021 connected in series and the second LED chip string 403 includes a plurality of second LED chips 4031 connected in series. The first LED chip string 402 and the second LED chip string 403 are electrically connected in parallel and the total resistance value of the first LED chip string 402 is different from the total resistance value of the second LED chip string 403. In an embodiment, the first LED chip 4021 and the second LED chip 4031 have the same model number so that they have the same resistance value. Yet the number of the first LED chips 4021 is different from that of the second LED chips 4031 so that the sum of the resistance values of the first LED chips 4021 is different from that of the second LED chips 4031. In another embodiment, the first LED chip 4021 and the second LED chip 4031 have different model numbers so that they have different resistance values. The number of the first LED chips 4021 can be larger, equal to or smaller than the number of the second LED chips 4031 and the sum of the resistance values of the first LED chips 4021 is different from that of the second LED chips 4031.

The high-color-temperature phosphor layer G1 that includes yellow-green phosphor covers the first LED chip string 402 while the low-color-temperature phosphor layer G2 that includes red phosphor and yellow-green phosphor covers the second LED chip string 403. The high-color-temperature phosphor layer G1 and the low-color-temperature phosphor layer G2 also cover a part of the surface of the substrate 401 without being provided with the first LED chip string 402 and the second LED chip string 403. The first electrode 404 and the second electrode 405 disposed on two ends of the LED emitter 40 respectively are electrically connected to the substrate 401.

Moreover, the first electrode 404 and the second electrode 405 are electrically connected to the first conductive member 1021 and the second conductive member 3021 respectively. Thus current flows through a current loop formed by the first conductive members 1021, the LED emitters 40 and the second conductive members 3021 when a voltage is applied to the LED lamp 1. Therefore the LED emitter 40 emits light L. In this embodiment, the LED lamp 1 includes two LED emitters 40. The number of the LED emitter 40 is not limited, able to be modified during production process based on users' needs or places the LED lamp 1 being used.

Figure 3:
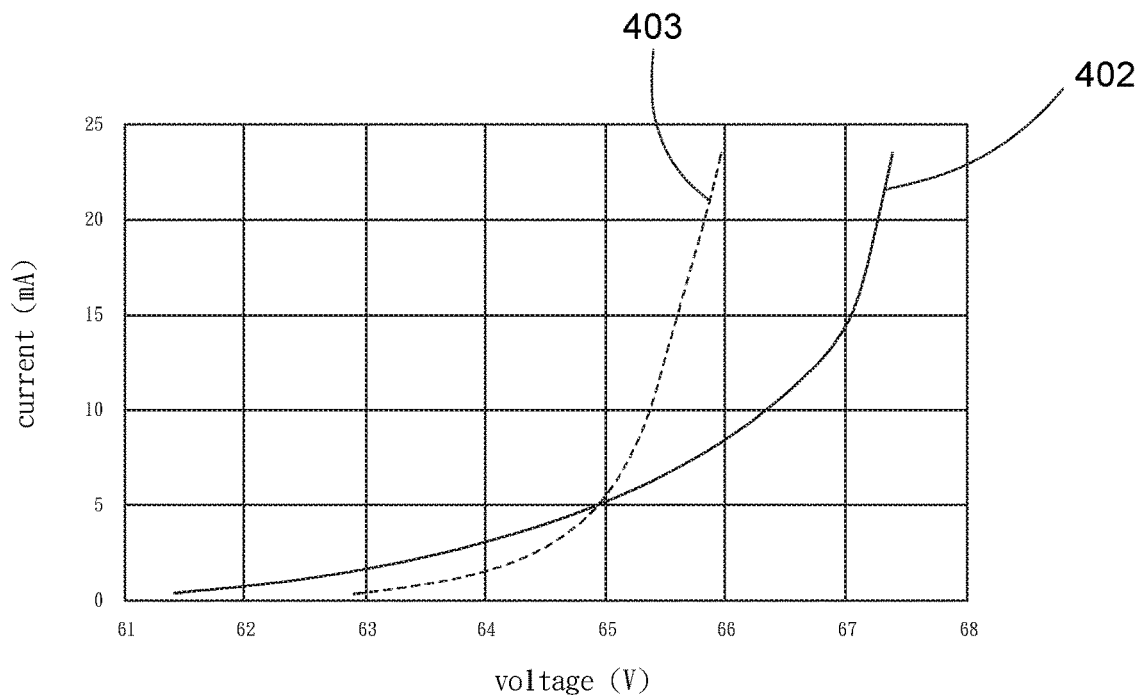
FIG. 3 is a current-voltage characteristic of a LED emitter of an embodiment according to the present invention.
Figure 4:
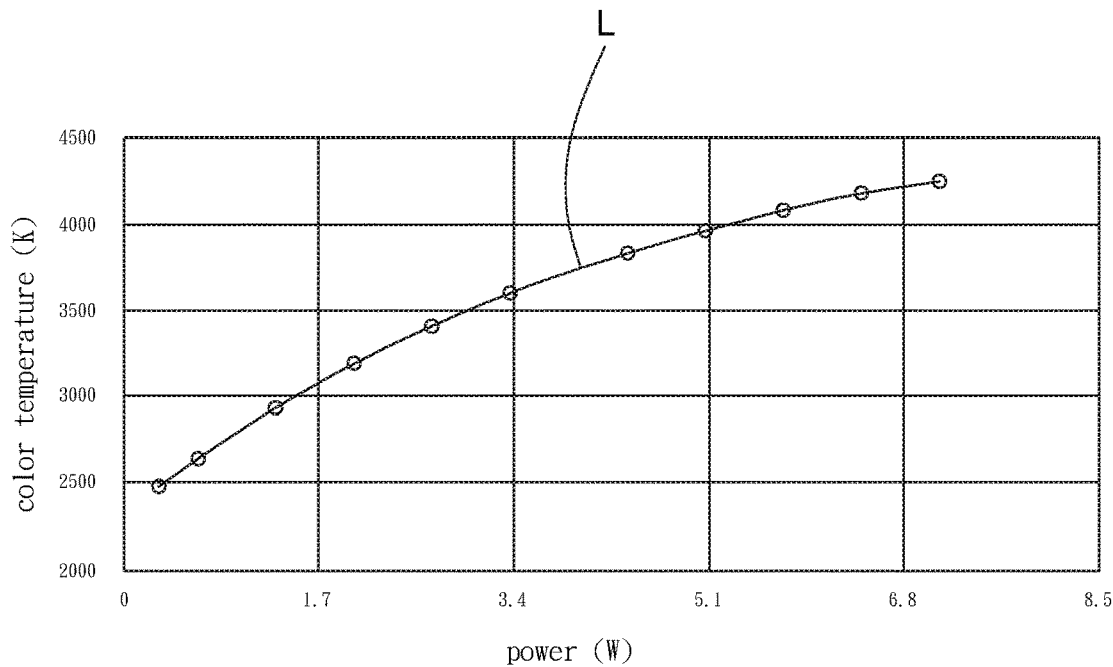
FIG. 4 is a color temperature curve of an embodiment of a LED lamp according to the present invention.

Refer to FIG. 3, a current-voltage characteristic of a LED emitter is revealed. The horizontal axis represents the voltage (V) and the vertical axis represents the current (mA). Refer to FIG. 4, the color temperature is plotted on the vertical axis and the power (W) on the horizontal axis. Refer to FIG. 3, the first LED chip 4021 and the second LED chip 4031 have the same resistance value while the second LED chip string 403 (represented by dashed line) includes twenty-four (24) second LED chips 4031 and the first LED chip string 402 (represented by solid line) includes twenty-five (25) first LED chips 4021. Thus the total resistance value of the first LED chip string 402 is larger than that of the second LED chip string 403.

When a voltage is applied to the LED lamp 1 and the voltage between the first conductive member 1021 and the second conductive member 3021 is increased gradually owing to the power improved by the circuit board 105, light emitted from the first LED chip string 402 and light emitted from the second LED chip string 403 are passed through the high-color-temperature phosphor layer G1 and the low-color-temperature phosphor layer G2 respectively to form light L with mixed color temperature (as shown in FIG. 2). The second LED chip string 403 has higher initial brightness because that the current is always larger (the dashed line of the second LED chip string 403 in FIG. 3) as the total resistance value of the second LED chip string 403 is smaller for a given voltage. Thus the light L generated during initial light emission of the LED emitter 40 has a lower color temperature, about 2500 K (as shown in FIG. 4). As long as the power is increased, the current of the first LED chip string 402 is gradually increased (the solid line of the first LED chip string 402 shown in FIG. 3) so that the brightness of the first LED chip string 402 is also getting higher little by little. Thus the color temperature of the light emitted from the LED emitter 40 is gradually increased from 2500K to 4300K (as shown in FIG. 4) along with the increasing power. Thereby the color mixing of the light is more even by current modulation of the first LED chip string 402 and the second LED chip string 403. The single LED emitter 40 can emit two kinds of light with different color temperatures so as to solve the problem of different projection angles and achieve better color mixing. Moreover, the color temperature of the light L emitted from the LED lamp can be kept within a certain range by the drive units of the circuit board 105 for control of the power of the LED lamp. For example, the color temperature of the light L is controlled below 3300K so that the LED lamp constantly emits warm color light L.

In summary, the color temperature of the light emitted from the present LED lamp can be adjusted gradually through the LED emitter with high and low color temperatures during power adjustment process. Thus the LED lamp has a better color mixing. Moreover, only the drive unit used for control of power needs to be disposed on the circuit board of the LED lamp so that not only the volume of the drive unit and the cost are significantly reduced, the operation and the regulation are also easier. The appearance of the LED lamp and the degree of freedom of internal wiring layout are also improved. Therefore the LED emitter and the light thereof are of great industrial value.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

What is claimed is:

1. A light emitting diode (LED) emitter comprising:
a first LED chip string that includes a plurality of first LED chips connected in series;
a second LED chip string that is connected to the first LED chip string in parallel and composed of a plurality of second LED chips connected in series;
a substrate where the first LED chip string and the second LED chip string are mounted;
at least two electrodes electrically connected to the substrate;
a high-color-temperature phosphor layer that covers the first LED chip string; and
a low-color-temperature phosphor layer that covers the second LED chip string;
wherein a total resistance value of the first LED chip string is different from a total resistance value of the second LED chip string;
wherein the resistance value of the first LED chip is different from the resistance value of the second LED chip and the number of the first LED chips is different from the number of the second LED chips.

2. The LED emitter as claimed in claim 1, wherein the first LED chip and the second LED chip have the same resistance value while the number of the first LED chips is different from the number of the second LED chips.

3. The LED emitter as claimed in claim 1, wherein a material for the substrate is selected from the group consisting of ceramic, sapphire, and metals.

4. A light emitting diode (LED) emitter comprising:
a first LED chip string that includes a plurality of first LED chips connected in series;

a second LED chip string that is connected to the first LED chip string in parallel and composed of a plurality of second LED chips connected in series;
a substrate where the first LED chip string and the second LED chip string are mounted;
at least two electrodes electrically connected to the substrate;
a high-color-temperature phosphor layer that covers the first LED chip string; and
a low-color-temperature phosphor layer that covers the second LED chip string;
wherein a total resistance value of the first LED chip string is different from a total resistance value of the second LED chip string;
wherein the resistance value of the first LED chip is different from the resistance value of the second LED chip while the number of the first LED chips is the same as the number of the second LED chips.

5. A LED lamp comprising:
a casing that includes a mounting space and an opening communicating with the mounting space;
a base mounted in the mounting space and having one end thereof connected to the opening for closing the mounting space and the other end thereof provided with at least one first conductive member;
a support that is arranged at the base, located at the same side of the base with the first conductive member, and having at least one second conductive member;
at least one LED emitter electrically connected to the first conductive member and the second conductive member, and including
a first LED chip string that includes a plurality of first LED chips connected in series;
a second LED chip string that is connected to the first LED chip string in parallel and composed of a plurality of second LED chips connected in series;
a substrate where the first LED chip string and the second LED chip string are mounted;
a high-color-temperature phosphor layer that covers the first LED chip string; and
a low-color-temperature phosphor layer that covers the second LED chip string;
wherein a total resistance value of the first LED chip string is different from a total resistance value of the second LED chip string;
wherein the resistance value of the first LED chip is different from the resistance value of the second LED chip while the number of the first LED chips is the same as the number of the second LED chips.

6. The LED lamp as claimed in claim 5, wherein the first LED chip and the second LED chip have the same resistance value while the number of the first LED chips is different from the number of the second LED chips.

7. The LED lamp as claimed in claim 5, wherein the resistance value of the first LED chip is different from the resistance value of the second LED chip and the number of the first LED chips is different from the number of the second LED chips.

8. The LED lamp as claimed in claim 5, wherein a material for the substrate is selected from the group consisting of ceramic, sapphire, and metals.

9. The LED lamp as claimed in claim 5, wherein the base includes a core rod, a circuit board and a mounting seat; the circuit board is disposed on one end of the core rod and closing the opening while the mounting seat is fixed on the other end of the core rod, opposite to the end with the circuit board.

10. The LED lamp as claimed in claim 9, wherein the first conductive member and the support are arranged at the mounting seat.

11. The LED lamp as claimed in claim 9, wherein the base includes a vent pipe; the vent pipe is mounted in the core rod and a part thereof is inserted through the circuit board.

12. The LED lamp as claimed in claim 9, wherein the LED lamp further includes a cap; the cap is connected to the casing and covering the opening.

13. The LED lamp as claimed in claim 12, wherein the cap includes a metal threaded housing and an electrical point connected to the metal threaded housing.

14. The LED lamp as claimed in claim 13, wherein the base includes at least two conductive wires; one ends of the two conductive wires are both electrically connected to the circuit board while the other ends thereof are connected to the metal threaded housing and the electrical point respectively.

15. The LED lamp as claimed in claim 5, wherein the support includes an axial rod and a support member; one end of the axial rod is connected to the base and the support member is disposed on the other end of the axial rod.

16. The LED lamp as claimed in claim 15, wherein the second conductive member is arranged at the support member.

* * * * *